Figure 1:
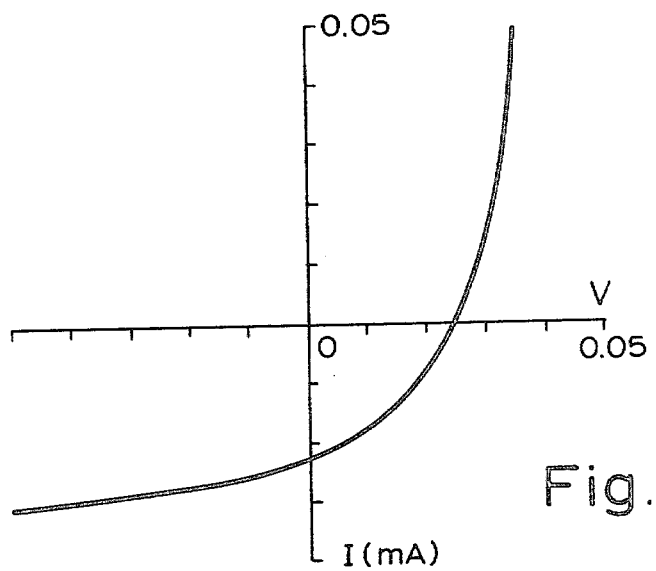

United States Patent [19]

Jenner et al.

[11] 4,318,217

[45] Mar. 9, 1982

[54] METHOD OF MANUFACTURING AN INFRA-RED DETECTOR DEVICE

[75] Inventors: Michael D. Jenner; Maurice V. Blackman, both of Southampton, England

[73] Assignee: U.S. Philips Corporation, New York, N.Y.

[21] Appl. No.: 178,645

[22] Filed: Aug. 15, 1980

[51] Int. Cl.³ ............................................ H01L 31/18
[52] U.S. Cl. ...................................... 29/572; 148/1.5; 148/188; 148/191; 204/37 R; 204/56 R
[58] Field of Search ............... 148/1.5, 187, 188, 191; 29/572; 204/37 R, 56 R

[56] References Cited

U.S. PATENT DOCUMENTS 3,977,018 8/1976 Catagnus et al. ...................... 357/30
4,206,003 6/1980 Koehler ................................ 148/1.5

FOREIGN PATENT DOCUMENTS 1568958 6/1980 United Kingdom ............ 204/56 R

OTHER PUBLICATIONS

G. Cohen-Solal et al., "Sputtered Mercury Cadmium Telluride Photodiode", *Infrared Physics*, vol. 16, pp. 555–559 (1976).

*Primary Examiner*—Aaron Weisstuch
*Attorney, Agent, or Firm*—Paul R. Miller

[57] ABSTRACT

In the manufacture of an infra-red detector device, at least a portion of a surface of a body of mercury cadmium telluride is subjected to a conversion treatment to produce a surface layer, after which a heating step is performed. The present invention involves a simple and reproducible process for forming in the body a p-n junction of sufficiently good quality for such a detector which can be of a planar form so as to facilitate the formation of the detector element arrays in the body and the provision of contacts to the detector elements.

12 Claims, 9 Drawing Figures

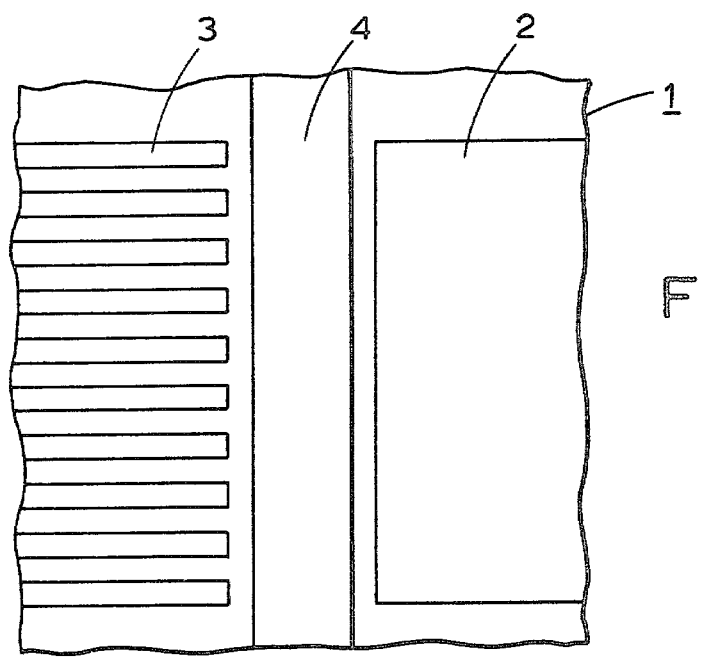
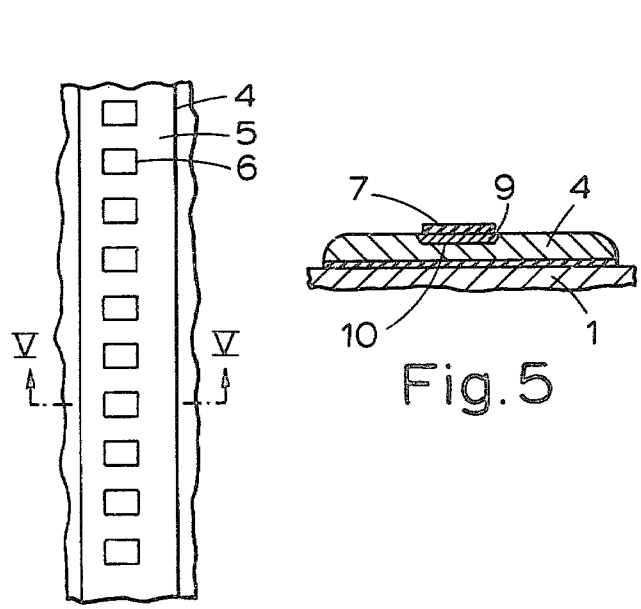
Fig. 3
Fig. 4
Fig. 5
Fig. 6

METHOD OF MANUFACTURING AN INFRA-RED DETECTOR DEVICE

This invention relates to methods of manufacturing infra-red radiation detector devices, particularly but not exclusively photovoltaic detectors having photosensitive p-n junctions.

British patent specification (GB) 1,568,958 discloses a method of manufacturing an infra-red radiation detector device in which at least a portion of a surface of a body of mercury cadmium telluride is subjected to a conversion treatment to produce a surface layer on the body, after which a heating step is performed. In the detector devices described in GB Pat. No. 1,568,958 the surface layer is produced by electrolytic anodising of the mercury cadmium telluride and is used to form on the device body surface a protective and passivating layer which enhances the detectivity of the device. The heating step is an optional baking treatment for the detector device at a temperature in the range of 60° C. to 70° C. which can serve to enhance the device characteristics, apparently by annealing the mercury cadmium telluride material of the detector device. This anodic passivating surface layer is provided, particularly but not exclusively on photoconductive detectors, namely detectors in which the operation is based on the intrinsic photoconductivity of the mercury cadmium telluride. However, GB Pat. No. 1,568,958 also mentions that such an anodic passivating layer may be provided on the surface of a photovoltaic detector device body. In this case a p-n junction is first formed in a previously known manner in the mercury cadmium telluride body, and subsequently the passivating surface layer is produced by electrolytic anodising of at least part of the major surface of the detector element via which the incident radiation to be detected passes to the p-n junction. The operation of a photovoltaic detector is based on the generation of a photovoltage by the photosensitive p-n junction, and so the quality of this junction is important for obtaining good detector characteristics. The anodizing invention described and claimed in GB 1,568,958 is not concerned with the formation of a photosensitive p-n junction, nor indeed with any type of p-n junction.

As in certain respects photovoltaic detectors are considered to be potentially superior to photoconductive detectors, for example due to their faster speed of response, lower power dissipation and possibility of operation without an external bias source, there has for a considerable period been a desire to manufacture photovoltaic detectors in which the or each element of the detector is of mercury cadmium telluride. This therefore necessitates the production of good-quality p-n junctions in the material and the provision of contacts to the regions on opposite sides of the p-n junctions. Good-quality p-n junctions are also useful for isolation purposes in photoconductive detectors.

Various different methods have been proposed for producing p-n junctions in mercury cadmium telluride. It is recognised that the electrical properties of the material can be influenced by producing a stoichiometric imbalance of the constituent elements of the material or by doping with a foreign impurity element. In the former case n-type characteristics may be produced by interstitial cadmium or mercury and p-type characteristics may be produced by mercury and/or cadmium vacancies or interstitial tellurium.

In specifying conductivity-type characteristics of mercury cadmium telluride, reference should be made to the temperature at which said characteristics are observed or used, because such characteristics are temperature dependent in the sense that for material of a specific composition there exists a temperature at which inversion of conductivity type characteristics can occur. Thus, for example, some material compositions used for forming the elements of detectors for operation at 77° K. exhibit n-type characteristics at room temperature, but at the temperature of operation they exhibit p-type characteristics. Furthermore for some material compositions in which the conductivity type characteristics of a particular region in the body result from an excess or a deficiency of one of the constituent elements, it is possible that the presence of p-n junction characteristics may not be observable at one temperature, for example at room temperature, but such p-n junction characteristics can be observed and of course utilised at another temperature, namely the intended operating temperature which may be, for example 77° K. Additionally, it should be understood that reference to characteristics of a certain conductivity type at a certain temperature is to be interpreted broadly in the sense that these characteristics may prevail over a range of temperatures within which the certain temperature is present.

In order to convert a surface adjoining part of a body material having at the detector operating temperature p-type characteristics into material having at said temperature n-type characteristics, it is known to diffuse mercury into such a p-type body by heating the body and a quantity of mercury in a sealed capsule. Using this process it is possible to produce fairly flat p-n junctions and to fabricate a detector element from such a body by forming a mesa structure, but this leaves the p-n junction exposed at the side surfaces of the element. This is undesirable unless special measures are taken to protect the side surfaces. Furthermore, if it is desired to form a detector comprising a plurality of detector elements, then to produce the elements in a common body requires controlled etching techniques, and the provision of contacts to the individual mesa-form elements gives rise to problems at least in so far as it is not readily possible to use a printed lead-out form of contact to the regions at the upper surfaces of the individual detector elements.

In order to fabricate so-called 'planar' forms of detector element it has been proposed to produce localised regions of opposite conductivity type in an initially homogeneous body of one conductivity type by selectively introducing a foreign element, for example aluminium, into the crystal lattice by diffusion or ion implantation, using a layer on the surface which selectively masks against such impurity introduction. However, the development of suitable masking layers and impurity introduction techniques has proved to be time consuming and, in so far as the latter are concerned, expensive in equipment.

Other methods have been proposed for obtaining p-n junctions in mercury cadmium telluride. These include the provision of layers of different conductivity types by vapour phase epitaxy, the implantation of mercury using photoresist masking, the sputtering of gold or aluminium into sputter deposited mercury cadmium telluride, and the diffusion of gold from a deposited gold containing layer.

According to the present invention, there is provided a method of manufacturing an infra-red radiation detector device in which at least a portion of a surface of a body of mercury cadmium telluride is subjected to a conversion treatment to produce a surface layer on the body, after which a heating step is performed, which method is characterized in that the surface layer produced by said conversion treatment comprises a sufficient quantity of an element derived from said body as to act subsequently as a source for re-introducing said element into said body, said element being a constituent of said body and being such that when present in an excess concentration in the material of said body it yields the characteristics of n-type material at the operating temperature of the detector device, and in that said surface layer is heated in said heating step to a temperature in excess of 100° C. to introduce a quantity of said element from the surface layer into an underlying region of the body so as to form a p-n junction in the body.

This method is based on the surprising discovery that it is possible to form in a reproducible manner a p-n junction of sufficiently good quality for a detector (for example, for use as the photosensitive junction of a photovoltaic detector) by these simple means of deriving from the body material itself (for example by an electrolytic anodising treatment) a source of an elemental constituent of said body for producing n-type characteristics and then heating to a temperature in excess of 100° C. so as to re-introduce said elemental constituent into the underlying region and to form said p-n junction. Furthermore, said source can be readily localised on a body surface so that even planar forms of detector elements can be formed in this simple manner.

Thus, in an important form of the method in accordance with the invention, during the heating step said surface layer is present locally on a part of a major surface of the body, and the underlying region having n-type characteristics produced by said element introduction only locally adjoins said major surface so that the p-n junction formed extends to the major surface so as to at least partly terminate in said major surface. Advantages of such a planar structure, for example as regards the provision of contacts, have been described previously, but as will be described hereinafter this form of the method in accordance with the invention can be used to manufacture many different forms of detector device, including monolithic arrays.

Preferably, the surface layer comprising the element source is produced on mercury cadmium telluride which has at said device operating temperature the characteristics of p-type material, so that said heating step results in said underlying region acquiring the characteristics of n-type material at said device operating temperature while the adjacent part of said body retains said p-type characteristics to form said p-n junction in the body. This process is particularly simple to operate. However, a more complex process may be used in which said surface layer is produced on mercury cadmium telluride which has at said device operating temperature the characteristics of n-type material, and in which said heating step results in said underlying region retaining said n-type characteristics due to said element introduction from said surface layer while the adjacent part of said body is converted by said heating step into material having at said device operating temperature p-type characteristics, so forming said p-n junction in the body. This more complex process may be less easy to implement and control in a reproducible manner, particularly when the starting material is an n-type body and a high temperature is needed in the heating step for the conductivity-type conversion. In a modified form of this more complex process which however requires more processing steps, the starting material is a body of mercury cadmium telluride having at said device operating temperature the characteristics of p-type material, and before producing said surface layer mercury is diffused into at least one surface of said body so as to form a surface-adjoining portion of said body having at said device operating temperature the characteristics of n-type material; thereafter said surface layer is produced on said surface-adjoining portion, and said heating step results in retaining n-type characteristics in said underlying region and out-diffusion of mercury from an exposed part of said surface-adjoining portion to convert said part into material having at said device operating temperature said p-type characteristics.

In a currently preferred form of the method in accordance with the invention, the treatment for producing the surface layer comprises the electrolytic anodising of the mercury cadmium telluride. It has been found that by electrolytically anodising and thereafter heating to a temperature in excess of 100° C. wafer-shaped bodies of mercury cadmium telluride, $Hg_{(1-x)}Cd_xTe$, it is possible inter alia (a) to produce p-n junctions of desired quality and exhibiting photosensitive characteristics at room temperature in material having a value of x in the region of 0.30 to 0.35, said material and the junctions thus produced being suitable, for example, for use in photovoltaic detectors designed for operation in the 3 to 5 micron wavelength window at room temperature and (b) to produce p-n junctions of desired quality and exhibiting photosensitive characteristics at 77° K. in material having a value of x over the whole range of 0.15 to 0.35, said material and the junctions thus produced being suitable, depending on the value of x, for example, for use in photovoltaic detectors designed for operation in the 8 to 14 micron wavelength window at 77° K., and for use in photovoltaic detectors designed for operation in the 3 to 5 micron wavelength window at 77° K. The exact physical mechanism by which the conductivity type inversion is produced is not fully understood but it is postulated that in the particular case of electrolytically anodising mercury cadmium telluride there is produced a surface layer which is rich in mercury, said mercury possibly being incorporated in the form of mercuric oxide. The subsequently effected heating step to a temperature in excess of 100° C. possibly yields free mercury which diffuses into the underlying body material. Simultaneously, the anodically produced surface layer acts as an out-diffusion mask of free mercury from the underlying material. In this manner, mercury is probably interstitially introduced into the crystal lattice thus giving rise to n-type characteristics in the underlying region.

It should be noted that this effect is not obtained by carrying out the method steps described in said previously published British patent specification (GB) 1,568,958, the inventors for which are the same as the inventors for the present invention. In the photoconductive detectors of GB Pat. No. 1,568,958 such mercury introduction into the n-type detector region would have increased the surface doping concentration to n+, so increasing the surface recombination velocity and reducing the passivating effect of the anodic surface layer. This is the opposite of what is required. Similarly, such mercury introduction into the photovoltaic detectors mentioned in GB Pat. No. 1,568,958 would have degraded the characteristics obtained from the photosensitive p-n junction previously formed in the detector body, and may even result, for example, in destroying or short-circuiting said p-n junction.

As the anodically produced surface layer does not constitute an infinite source of mercury, the resultant characteristics of the underlying material, in particular the characteristics and depth of the p-n junction formed, will be highly dependant on the heating conditions, namely time and temperature, and upon the initial thickness of the anodically produced surface layer.

The treatment comprising the electrolytic anodising of the mercury cadmium telluride may be effected to produce a surface layer having a thickness in the range of 100 Å to 3,000 Å, for example a thickness of approximately 2,000 Å. With a layer in said thickness range it is possible to produce p-n junctions in material over a wide range of compositions.

The heating may be effected at a temperature in the range of 125° C. to 270° C. and for a period in the range of 100 seconds to 40 hours. Generally, the higher the temperature the shorter is the period required to produce a suitable conductivity type conversion. Furthermore, the time of heating will depend much upon the thickness of the anodically produced surface layer as the size of the source of conductivity type inversion species is not infinite and depends upon the thickness of the layer. Also for certain applications, for example for photovoltaic infra-red detector devices, it may be desired to produce the p-n junction very close to the surface and therefore unduly long heating periods may cause an undesired diffusion of the said species into the body, resulting in a deep p-n junction which may have poor characteristics. In some circumstances it may be necessary to remove material from the surface subsequent to the heating step in order to obtain a shallow junction.

So far as localisation of the surface layer is concerned, it is possible to provide such an anodically-produced surface layer extending locally on a part of a major surface either by only locally anodising said part of the surface or by anodising the whole surface and thereafter removing part of the surface layer thus produced.

With the ability to form planar p-n junctions in a simple manner in accordance with the invention, various different detector devices can be formed having one or more p-n junctions terminating in a major surface of the device body. Thus, during the heating step, the extent of the surface layer produced on the major surface may be such that the major part of the p-n junction formed extends substantially parallel to said major surface and constitutes the photosensitive p-n junction of a photovoltaic infra-red detector element of the detector device. In this case, said surface layer may be in the form of an array of separate parts on said major surface so that an array of island-shaped regions having at the device operating temperature the characteristics of n-type material are formed in a common body part having the characteristics of p-type material, and after the heating step each n-type region is provided with a conductive connection and the p-type body part is provided with at least one common conductive connection. In this manner, it is readily possible to produce a monolithic array, for example a linear array or a matrix, of photovoltaic detector elements in a common body.

A method in accordance with the invention may also be used to form an array of surface adjoining island regions having the characteristics of n-type material in a common body having the characteristics of p-type material, each n-type region being provided after the heating step with spaced first and second conductive connections, to form a photoconductive infra-red detector element of the device. In this manner, it is possible to form a monolithic array (for example, a linear array or a matrix) of photoconductive detector elements in a common body, assuming of course that suitable isolation can be provided between the elements, and a photoconductive effect can predominate over the photovoltaic effect in which free charge carriers are separated by fields associated with the p-n junctions. This may be advantageous compared with prior art arrays comprising a plurality of mercury cadmium telluride bodies individually applied on a supporting substrate. The provision of the elements in a common body readily facilitates the provision of contacts to the elements and also enables the spacing between adjacent elements to be accurately controlled.

In a method in which the surface layer with the element source is localized at a major surface of the body, after the heating step at least a peripheral portion of the surface layer extending adjacent where said p-n junction terminates in the surface may be removed. This may be particularly advantageous when the surface layer is formed by electrolytic anodising because the presence of an anodic surface layer on the p-n junction termination may degrade the junction characteristics, possibly due to accumulation below the anodised layer.

After the heating step, the surface layer may be removed and an etching treatment effected to remove material from the one surface, and a further electrolytic anodising of at least a part of the major surface bounded by the termination of the p-n junction in said surface may be effected to passivate said surface.

Embodiments of the invention will now be described, by way of example. Initially, some examples of forming p-n junctions in bodies of mercury cadmium telluride of various different compositions will be described together with details of the characteristics of the junctions obtained and thereafter some embodiments in which infra-red detector elements are manufactured will be described with reference to the accompanying drawings.

Figure 2:
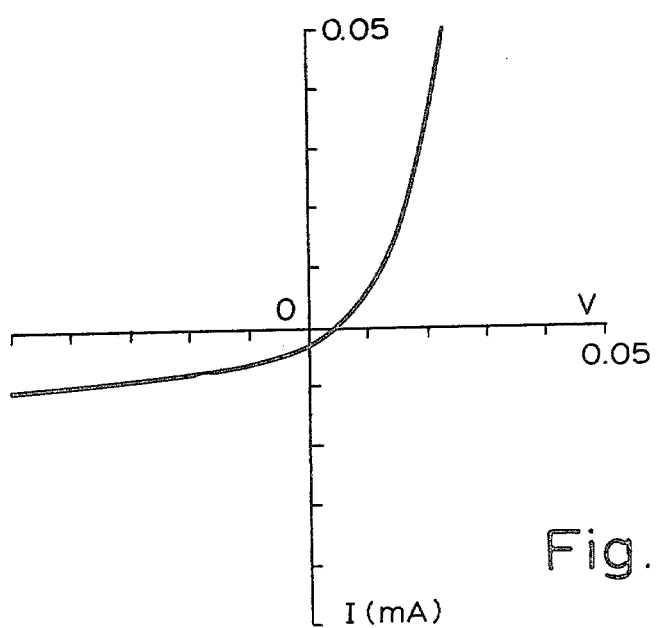
Figure 7:
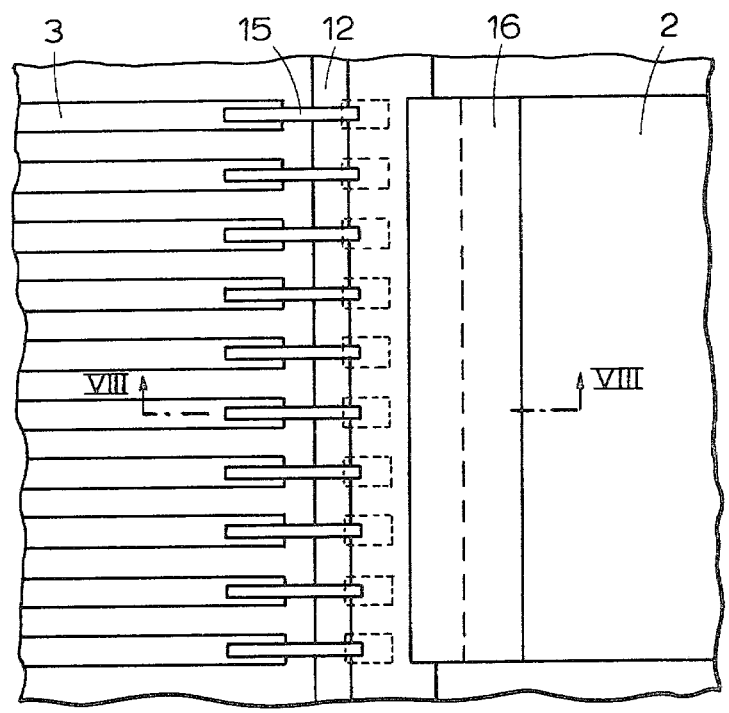
Figure 9:
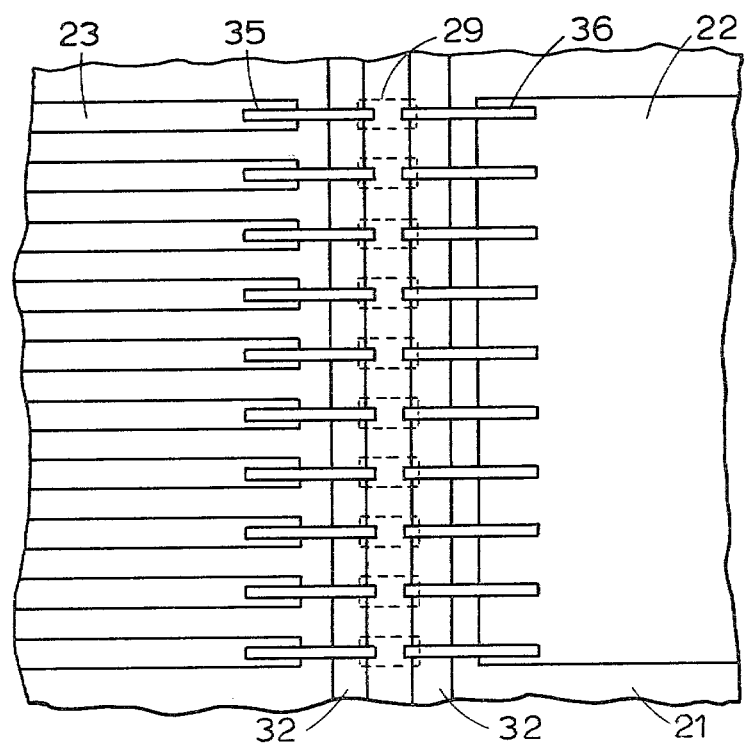
Figure 8:
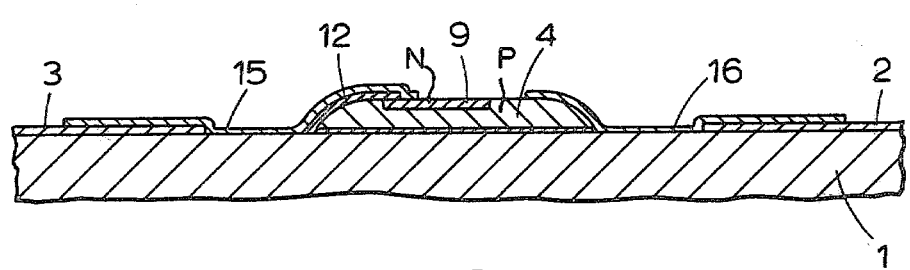

FIGS. 1 and 2 show the measured voltage/current characteristics of two different p-n junctions formed in a body of mercury cadmium telluride by a method in accordance with the invention;

FIGS. 3 to 8 illustrate various stages in the manufacture of a ten element photovoltaic infra-red detector array device by a method in accordance with the invention, FIGS. 3, 4, 6 and 7 being diagrammatic plan views and each including the mercury cadmium telluride elemental body of the device and a part of a supporting substrate on which said body is mounted, FIGS. 5 and 8 being diagrammatic cross-sections through part of said body at two different stages of manufacture, and FIG. 9 shows in diagrammatic plan view part of a ten element photoconductive infra-red detector array device manufactured by a method in accordance with the invention.

It should be noted that FIGS. 3 to 9 are not drawn to scale. The relative dimensions and proportions of some parts of these FIGS. (especially in cross-section) have been shown exaggerated or reduced for the sake of clarity and convenience.

Some outline experimental details of the preparation of p-n junctions in mercury cadmium telluride by a method in accordance with the invention will now be given. Samples from polished slices of approximately 200 microns thickness obtained from various mercury cadmium telluride ingots in the composition range of x lying between 0.15 and 0.35 were prepared by first anodising defined surface areas in a solution of sodium bicarbonate using a masking of photoresist such as SHIPLEY AZ 1350 H. The anodised slices were then heated to 180° C. for 1 hour either in vacuum or nitrogen atmosphere. After heating, the slices were etched for 10 minutes in a 5% solution of bromine in ethylene glycol and gold contacts applied by sputtering onto both the anodised and unanodised regions through a suitable photoresist mask. The I-V characteristics were then measured.

FIG. 1 shows the measured current/voltage characteristics of one such p-n junction produced by the experiment. This junction was formed below an anodised surface area of circular form of 280 microns diameter. The characteristics were obtained with $2\pi$ solid angle full ambient illumination.

FIG. 2 shows the characteristics of another sample, in this case the p-n junction formed under the same conditions being of a rectangular surface area of 125 microns × 185 microns. The characteristics were obtained with 60° field of view and show a smaller off-set voltage than the sample whose characteristics are shown in FIG. 1.

An embodiment of the method in accordance with the invention will now be described in which a linear array of photo-voltaic infra-red detector elements are formed in a common body, the array being employed in a photo-voltaic infra-red detector device suitable for operation in the 8 to 14 micron window at 77° K.

The starting material is a slice of mercury cadmium telluride of 11 mm. diameter and 450 microns thickness having the composition $Hg_{0.8}Cd_{0.2}Te$. It has the characteristics of n-type material at room temperature and the characteristics of p-type material at 77° K. Typically, the acceptor carrier concentration at 77° K. is $2 \times 10^{17}$ cm$^{-3}$, the mobility is $1.5 \times 10^2$ cm$^2$V$^{-1}$sec$^{-1}$ and the resistivity is 0.2 ohm. cm. For the sake of convenience of explanation, this material will hereinafter be referred to as p-type material. The slice is mounted on a ceramic polishing block with a layer of wax. Polishing of the surface of the wafer is effected by a rotary machine using a base lap and an abrasive slurry. The polishing is a multi-stage process with progressively less damage being produced in the crystal structure as the thickness is reduced to 400 microns, this being effected by the use of progressively finer abrasive particles and base laps. When the thickness has been reduced to 400 microns as determined by peripheral shoulders on the polishing block, an etching treatment is effected on the exposed surfaces of the wafer still mounted on the polishing block. This removes a further 50 microns from the surface. The wafer is now removed from the polishing block and is adhered via the treated major surface to a further polishing block. Polishing is effected using the same conditions of using progressively finer abrasive particles and base laps until the thickness is reduced to 250 microns. Thereafter, an etching treatment is effected to remove a further 50 microns from the exposed surface.

With the wafer of approximately 200 microns thickness still adhered via a wax layer to the polsihing block a layer of photoresist is applied to the upper surface. A photomasking and developing process is then effected to define a plurality of substantially parallel strip-shaped openings in the photoresist layer. An etching treatment is then effected to form in the wafer a first plurality of substantially parallel extending channels which define on the polishing block a plurality of substantially parallel extending strip portions of mercury cadmium telluride. Typically, in the context of forming either single element detectors or linear array detectors, the strip portions will be of 1 mm width. The residual photoresist layer is removed and a further etching treatment effected to round the upper edges of the strip portions.

The next stage in the processing is the application of a layer of photoresist on the upper surfaces of the strip portions. Using a conventional photomasking and developing process, a plurality of substantially parallel extending strips extending substantially normal to the longitudinal direction of the strip portions are removed from the photoresist layer. The spacing of said strips is determined by the form of detector element required. Typically, for single element detectors the spacing may be approximately 1 mm in order to yield elements of 1 mm × 1 mm. For linear arrays, the spacing corresponds to the length of the elements, and in the present example the spacing is 3 mm. Using the defined photoresist as an etching mask, an etching treatment is effected to obtain, by etching completely through the wafer, a plurality of parallel extending channels and thereby define on the polishing block an array of substantially rectangular elemental body portions, in the present example each of 3 mm × 1 mm, the longitudinal edges on two opposite sides of which are slightly rounded.

Dependent upon the particular form of detector required, particularly having regard to the desired method of mounting the elemental body portion and the provision of electrical contacts to the individual detector elements, there are a variety of ways of proceeding from this stage. In some embodiments, in particular for forming single element detectors, at least part of the treatment required to produce the p-n junctions in a plurality of elemental body portions is effected while the body portions are still present on the polishing block. For example, a photoresist layer may be applied and the sensitive areas defined in the elemental body portions prior to effecting an electrolytic anodising treatment on the exposed areas which are to correspond in size to the desired sensitive areas. In such a form, the elemental body portions are only removed from the polishing block after the electrolytic anodising treatment. A subsequent heat treatment to produce the p-n junctions below the anodically formed surface layer may then be effected on the bodies either in a free condition or already mounted on a suitable substrate. However, in the present embodiment, after defining the elemental body portions of 3 mm × 1 mm on the polishing block, they are individually removed and individually mounted on a ceramic substrate having on one major surface a printed lead-out contact pattern. FIG. 3 shows in plan view part of one such substrate having mounted thereon one of the elemental body portions of p-type (at 77° K.) mercury cadmium telluride of 3 mm × 1 mm end obtained by the described method, only part of said elemental body portions being shown in the Figure. The substrate 1 is of high density alumina of 0.5 mm thickness. On the upper surface there is a printed lead-out contact pattern of gold plated nichrome of 0.5 micron thickness. The contact pattern comprises a common lead-out conductor 2 of 1.9 mm width and ten further lead-out conductors 3 each of 100 microns width and having a pitch of 200 microns. The elemental body portion 4 of p-type material is secured to the substrate 1 by a layer of epoxy resin. The spacing of the facing end surfaces of the conductors 2 and 3 is 1.4 mm.

A photoresist layer is now applied to the upper surface area of the assembly of the ceramic substrate 1 and mounted p-type body 4. A photomasking and developing process is effected to define in the photoresist layer ten areas, each of 150 microns × 100 microns, with a mutual separation of 100 microns. FIG. 4 shows in plan view the element 4 having the photoresist layer 5 thereon with ten openings 6 therein.

An electrolytic anodising treatment is now effected. This is carried out by immersing the assembly of the elemental body 4 and supporting substrate in a bath containing a solution of sodium bicarbonate. The electrical connection of the body 4 to the positive terminal of the supply is via a tungsten wire; and an electrode of gold present in the solution is connected to the negative terminal of the supply. Anodising is effected with a constant applied voltage of 15 volts at an initial current of 7.5 mA for a total period of 1 minute. This treatment may be repeated several times, with a removal of the anodically produced surface layer at each step. This anodic treatment, or when a repeated treatment is effected, such a final step produces on each of the areas, which during this treatment are not covered with photoresist, a surface layer of approximately 2,000Å thickness. Although it has not been possible to ascertain the precise composition of this layer, various experimental tests and procedures effected on similar surface layers produced on other bodies of mercury cadmium telluride using the same and other electrolytes in the anodising bath, indicate that one constituent of the layer is mercuric oxide.

The next step in the processing is the removal of the residual part of the photoresist layer 5. Thereafter, the assembly is subjected to a heating treatment in either vacuum or nitrogen at atmospheric pressure in a diffusion furnace at a temperature of 180° C. for a period of 1 hour. This heating step results in the conversion of a surface adjoining region of the body. The conversion is such that at the intended temperature of operation (77° K.), said region has the characteristics of n-type material and a p-n junction is present between said region and the remainder of the body which at said temperature exhibits p-type characteristics. For the sake of convenience of illustration this region is shown in the section of FIG. 5, taken along a line corresponding to the line V—V in FIG. 4, as an n-type region 9 forming a p-n junction 10 with the p-type body 4. The p-n junction 10 is shown terminating in the surface just outside the periphery of the anodically produced surface layer 7. The p-n junction for the major part extends substantially parallel to the upper surface of the body and at a depth therefrom of approximately 6 microns.

The anodically produced surface layer 7 is then removed by etching, and a further etching treatment effected to remove approximately 0.5 micron from the surface of the mercury cadmium telluride body.

A further layer of photoresist is now applied across the whole surface of the mercury cadmium telluride body, and, with the aid of a mask is partially exposed and thereafter partially removed, so that a longitudinal strip of 375 microns width remains uncovered extending along one side of the element. The uncovered portion of the body includes a small portion of each anodised area of the elemental portions. A dielectric layer, for example an epoxy resin layer, is now applied so that it covers the exposed surface portion, the resin being applied to yield a layer of between 3 and 4 microns thickness.

FIG. 6 shows in plan view the body subsequent to the application of the epoxy resin strip 12 and dissolving the photoresist strip.

A further photoresist layer is then applied across the whole surface of the body 4 and the substrate 1, including the printed lead-out contact pattern. The resist layer is exposed using a mask and an subsequently dissolving the exposed portions apertures are thereby provided in the photoresist layer. These apertures include openings of 40 microns × 25 microns extending over the n-type regions 9 and as strips of 40 microns width extending therefrom above the epoxy resin layer and over the conductors 3. Adjacent the other longitudinal edge of the element 4, a strip aperture of 1 mm width is present in the photoresist layer and extends also over the adjacent edge of the common lead-out conductor 2 by 0.55 mm. A layer of gold of 0.5 micron thickness is now deposited by sputtering over the whole surface. The deposited gold extends in the apertures in the photoresist layer in contact with the various exposed regions and layers. The gold deposited on the photoresist is removed by a lift-off technique, that is by dissolving the remaining photoresist. FIG. 7 shows in plan view the assembly subsequent to removing the excess gold. Ten gold straps 15 each extend at one end in contact with an n-type surface region 9 and at the other end in contact with a lead-out conductor 3. A single gold strap 16 extends in contact with the upper surface of the p-type body 4 and in contact with the common lead-out conductor 2. The straps 15 each are insulated from an underlying portion of the p-type body part due to the presence of the epoxy resin layer 12.

In this manner, a ten element linear array photo-voltaic detector is formed in a simple manner. As a final step in the manufacture, prior to encapsulating the array, it may be desirable to lightly etch the whole structure to improve the characteristics on removal of a thin layer of a few hundred Angstrom units from the surface of the device.

It will be appreciated that many modifications may be made in the processing, particularly with regard to the method of contacting after forming the p-n junctions. Thus, in one such modification subsequent to the junction forming step and removal of the anodic surface layer, a fresh anodic surface layer is provided locally on each sensitive area but lying within the boundary of each p-n junction where said junction terminates in the surface. In this manner, a protective layer is formed which is found to enhance the properties of the detector at least insofar as the possible degradation of the characteristics when subjecting the device to temperatures up to 70° C. may not be apparent. When applying this modification, the further contacting of the n-type regions is via openings formed in the last applied anodic layer.

A further modification will now be described with reference to FIG. 9, in which the previously described embodiment is modified to produce a linear array of photoconductive detector elements in a common body. The device comprises a ceramic substrate 21 with a correspondingly arranged pattern of printed lead-out conductors 22, 23. The element is of the same external dimensions, with the areas of the n-type regions 29 200 microns × 100 microns. Each n-type region 29 is contacted on opposite sides by strips 35 and 36, each of which extends over the p-type body part and is insulated therefrom by an epoxy layer 32. The strips 35 extend in contact with the lead-in conductors 23 and the strips 36 contact the common lead-out conductor 22.

It will be appreciated that many further modifications are possible within the scope of the invention. For example, when producing the surface layer containing the conductivity type inverting species by electrolytic anodising, other solutions may be employed, for example sodium carbonate, and the carbonates and bicarbonates of lithium and potassium. As an alternative to producing said layer by anodising it is possible to produce a form of native oxide containing an excess of the 'doping' species by chemical conversion, for example, using an oxidizing solution such as hydrogen peroxide. It is found that when treating mercury cadmium telluride bodies with such a solution and thereafter heating, p-n junctions may be formed extending below the surface oxide layer produced.

In the embodiments described, the conductivity type conversion is of a surface adjoining region. However, within the scope of the invention the method may be employed to produce buried regions of which the conductivity type is opposite to that of the surrounding material.

A further form of the method will now be described by way of another embodiment which is a modification of the method described with reference to FIGS. 3 to 8. In this embodiment, the starting material composition and the slice preparation is exactly the same up to and including the polishing and etching step, to produce a slice of 200 microns thickness. The method then differs insofar as this slice is then heated in a sealed capsule additionally containing an excess quantity of mercury. The heating is at 250° C. for 1 hour. This produces, by in-diffusion of mercury, a surface layer of 10 microns depth having n-type characteristics at 77° K. The n-type layer is completely removed from one major surface by polishing and approximately 2 microns is removed by etching from the opposite surface. The body in the form of a p-type (77° K.) slice having an n-type surface layer (77° K.) is then treated as in the embodiment previously described in order to produce elemental body portions of desired sizes, for example 3 mm × 1 mm as in the previously described embodiment, but each having an n-type surface layer of approximately 8 microns thickness. The method then is substantially the same, insofar as the electrolytic anodising treatment is effected in the same manner and over areas which are in excess of the finally desired sensitive areas in order to allow space for application of a later applied insulating layer, for example, an epoxy resin, over one side of the junction to be formed, and also a contact area.

Following the electrolytic anodising, the photoresist masking used during the anodising is removed and heating is effected at 180° C. for 1 hour. This results in the conversion of the uncovered parts of the n-type surface layer back to material having p-type characteristics. Mercury previously in-diffused at these areas is in this heating step out-diffused. However as the portions of the n-type surface layer below the anodically produced surface layer 7 remain n-type and substantially of the same depth it appears that the said surface layer 7 acts firstly as an out-diffusion mask against mercury out-diffusion, and also as a local source of mercury for the further in-diffusion of mercury. The latter property is based upon the assumption that without such an additionally provided localised source of mercury, the previously in-diffused mercury concentration would be dispersed into the body on heating at such a temperature, namely 180° C. for 1 hour.

We claim:

1. A method of manufacturing an infra-red radiation detector device comprising at least a portion of a surface of a body of mercury cadmium telluride being subjected to a conversion treatment to produce a surface layer on the body, after which a heating step is performed, characterized in that the surface layer produced by said conversion treatment comprises a sufficient quantity of an element derived from said body as to act subsequently as a source for re-introducing said element into said body, said element being a constituent of said body and being such that when present in an excess concentration in the material of said body it yields the characteristics of n-type material at the operating temperature of the detector device, and in that said surface layer is heated in said heating step to a temperature in excess of 100° C. to introduce a quantity of said element from the surface layer into an underlying region of the body so as to form a p-n junction in the body.

2. A method according to claim 1, wherein said surface layer is produced on said mercury cadmium telluride which has at said device operating temperature the characteristics of p-type material, and wherein said heating step results in said underlying region acquiring the characteristics of n-type material at said device operating temperature while the adjacent part of said body retains said p-type characteristics to form said p-n junction in the body.

3. A method according to claim 1, wherein said surface layer is produced on said mercury cadmium telluride which has at said device operating temperature the characteristics of n-type material, and wherein said heating step results in said underlying region retaining said n-type characteristics due to said element introduction from said surface layer while the adjacent part of said body is converted by said heating step into material having at said device operating temperature p-type characteristics, so forming said p-n junction in the body.

4. A method according to claim 3, wherein, before producing said surface layer, mercury is diffused into at least one surface of said body of mercury cadmium telluride having at said device operating temperature the characteristics of p-type material so as to form a surface-adjoining portion of said body having at said device operating temperature the characteristics of n-type material, wherein said surface layer is produced on said surface-adjoining portion, and wherein said heating step results in out-diffusion of mercury from an exposed part of said surface-adjoining portion to convert said part into material having at said device operating temperature said p-type characteristics.

5. A method according to claim 1, wherein during the heating step said surface layer is present locally on a part of a major surface of the body, and the underlying region having n-type characteristics produced by said element introduction only locally adjoins said major surface so that the p-n junction formed extends to the major surface so as to at least partly terminate in said major surface.

6. A method according to claim 5, wherein, during the heating step, said surface layer is in the form of an array of separate parts on said major surface so that an array of surface adjoining island regions having the characteristics of n-type material are formed in a common body having the characteristics of p-type material, and after the heating step each n-type region is provided with spaced first and second conductive connections to form a photoconductive infra-red detector element of the detector device.

7. A method according to claim 5, wherein after the heating step at least a peripheral portion of said surface layer extending adjacent where said p-n junction terminates in the major surface is removed.

8. A method according to claim 7, wherein after the heating step the surface layer is removed, an etching treatment is effected to remove material from said major surface, and at least a part of the major surface bounded by the termination of the p-n junction in said surface is electrolytically anodised.

9. A method according to claim 1, wherein after the heating step at least a peripheral portion of said surface layer extending adjacent to where said p-n junction terminates in the major surface is removed.

10. A method according to claim 1, wherein, during the heating step, the extent of said surface layer on a major surface of the body is such that at least the major part of the p-n junction formed extends substantially parallel to said major surface and constitutes the photosensitive p-n junction of a photovoltaic infra-red detector element of the detector device.

11. A method according to claim 10, wherein, during the heating step, said surface layer is in the form of an array of separate parts on said major surface so that an array of island regions having the characteristics of n-type material are formed in a common body part having the characteristics of p-type material, and after the heating step each n-type region is provided with a conductive connection and the p-type body part is provided with at least one common conductive connection.

12. A method according to claim 1, wherein the conversion treatment for producing said surface layer with said element comprises electrolytically anodising said mercury cadmium telluride, and heating the body at a temperature in the range of 125° C. to 270° C. for a period in the range of 100 seconds to 40 hours to form said p-n junction.

* * * * *